United States Patent [19]
Van Brunt

[11] Patent Number: 5,606,268
[45] Date of Patent: Feb. 25, 1997

[54] DIFFERENTIAL TO SINGLE-ENDED CMOS CONVERTER

[75] Inventor: Roger Van Brunt, San Francisco, Calif.

[73] Assignee: Apple Computer, Inc., Cupertino, Calif.

[21] Appl. No.: 389,075

[22] Filed: Feb. 14, 1995

Related U.S. Application Data

[63] Continuation of Ser. No. 36,137, Mar. 24, 1993, abandoned.

[51] Int. Cl.$^6$ ................. H03K 19/0185; H03K 19/0948
[52] U.S. Cl. ................. 326/68; 326/73; 326/81; 327/541
[58] Field of Search ................. 307/475, 451, 307/443, 296.6, 296.8, 263; 326/68, 73–74, 80–81, 17, 21; 327/170, 538–539, 541, 543

[56] References Cited

U.S. PATENT DOCUMENTS

| | | | |
|---|---|---|---|
| 4,340,867 | 7/1982 | Sano | 307/448 |
| 4,437,171 | 3/1984 | Hudson et al. | |
| 4,939,393 | 7/1990 | Petty | 307/475 |
| 5,113,097 | 5/1992 | Lee | 307/475 |
| 5,153,465 | 10/1992 | Sandhu | 307/296.8 |
| 5,204,557 | 4/1993 | Nguyen | 307/451 |
| 5,268,872 | 12/1993 | Fujii et al. | 365/189.07 |

FOREIGN PATENT DOCUMENTS

| | | |
|---|---|---|
| 223627 | 5/1987 | European Pat. Off. |
| 411789 | 2/1991 | European Pat. Off. |
| 501085 | 9/1992 | European Pat. Off. |
| 4-78221 | 3/1992 | Japan ................. 307/475 |

OTHER PUBLICATIONS

Sedra et al. *Microelectronic Circuits*. Holt, Rinehart, and Winston, 1987. pp. 508–509.

Pederson et al. *IEEE International Solid State Circuits Conference*, vol. 32, Feb. 1989, pp. 226–345, "High–Speed Digital Circuits" see p. 226, left column, lines 21 and 33, figures 2–5.

*Primary Examiner*—Edward P. Westin
*Assistant Examiner*—Jon Santamauro
*Attorney, Agent, or Firm*—Blakely, Sokoloff, Taylor & Zafman

[57] ABSTRACT

A differential-to-CMOS level signal converter which receives a first differential signal having a small amplitude difference between the binary signals. The differential-to-CMOS level converter amplifies and level shifts the binary differential signal and outputs a single-ended CMOS level signal suitable for use by digital CMOS logic. A circuit for biasing the differential-to-CMOS level converter is coupled to the level shifting circuitry.

19 Claims, 4 Drawing Sheets

DIFFERENTIAL TO SINGLE-ENDED CMOS CONVERTER

This is a continuation of application Ser. No. 08/036,137, filed Mar. 24, 1993, now abandoned.

BACKGROUND OF THE INVENTION

1. Field of the Invention

The present invention relates to the field of data communications. More particularly, the present invention relates to converting high speed differential serial transmission signals to single-ended CMOS logic circuit level signals.

2. Description of Related Art

It is well-known in the data communications field that for the transmission of high bit rate data signals small differential signals provide a number of advantages. A differential channel provides rejection of common mode noise present between a transmitting and receiving node such as power supply noise. Differential signals can be transmitted on twisted pair cables which are less expensive than coaxial or fiber optic cables and which when shielded offer very good rejection of interference from external noise sources. Using small signal level differential signals on a shielded twisted pair cable reduces EMI emissions, simplifies transmitter design and reduces power dissipation.

One of the most important characteristics of a differential communication channel is that it reduces timing distortion due to mismatched rise and fall times and receiver threshold. Timing distortion must be minimized since in a digital communication system data is encoded in both time and amplitude. FIG. 1(a) illustrates a single-ended system with mismatched rise and fall times and a threshold VT. As can be seen the mismatch in rise and fall times causes duty cycle distortion (Tpulse does not equal $T_{bc}$ where $T_{bc}$ is the bit cell width and Tpulse is the received pulse width.) It is very difficult in a single-ended communication system to match the rise and fall times and this mismatch becomes significant when data rates become high (50 Mbaud or more).

Differential systems on the other hand do not suffer duty cycle distortion due to rise and fall time mismatch. As shown in FIG. 1(b), as long as signal A and B have equivalent rise times and equivalent fall times the signal's pulse width is preserved. This type of matching is much more simple to guarantee in an integrated circuit design that has a symmetric layout for the A and B signals. It is also important to note that in a differential receiver the threshold is not set externally as in the single-ended system which was set by the VT reference shown in FIG. 1(a). Instead, the threshold in a differential system is a function of the received signal and therefore tracks with the received signal corresponding to when A=B (the signal crossing point).

Circuits composed of CMOS digital logic generally require signal swings having a range of 5 or 3 volts, usually between +5 volts and 0 volts or +3 to 0 volts. When a CMOS circuit receives a small amplitude differential binary signal, it is necessary to convert the binary differential signal into a single-ended signal amplified to CMOS digital voltage levels usable by the CMOS logic. As data transmission rates increase, it is necessary that the signal conversion circuitry be able to handle ever faster incoming differential signals for conversion to digital levels.

In other technology areas it has been necessary to convert signals from one domain to another domain. U.S. Pat. No. 4,437,171 illustrates circuitry for converting ECL level signals to signals suitable for use by a MOS memory.

SUMMARY OF THE INVENTION

It is an object of the present invention to provide an apparatus for receiving a small differential signal and for providing corresponding information at CMOS digital levels.

It is another object of the present invention to provide differential-to-CMOS level signal conversion while minimizing the pulse-width distortion of the transmitted signal.

It is further an object of the present invention to provide a means for biasing a differential-to-CMOS converter to ensure that signal level transitions occur at a predictable signal level.

These and other objects of the present invention are provided by a differential-to-CMOS level signal conversion apparatus which receives a differential signal having a small amplitude difference between the binary signals. The differential-to-CMOS level converter amplifies and level shifts the binary differential signal and outputs a single ended CMOS level signal suitable for use by digital CMOS logic circuits. A circuit for biasing the differential-to-CMOS level converter is provided for ensuring that signal transitions are detectable at a proper threshold.

BRIEF DESCRIPTION OF THE DRAWINGS

The objects, features and advantages of the present invention will be apparent from the following detailed description in which.

DETAILED DESCRIPTION OF THE INVENTION

A method and apparatus are described for the conversion of small amplitude differential serial data transmission signals to single-ended digital CMOS level signals. In the following description, many specific details are set forth such as relative voltage levels, etc., in order to provide a thorough description of the present invention. It will be apparent, however, to one of ordinary skill in the art that the present invention may be practiced without such specific details. In other instances, well-known structures and techniques have not been described in detail in order not to obscure unnecessarily the present invention.

The preferred embodiment of the present invention is intended to be incorporated into a data bus receiving module for use in a data communication system where information is transmitted in serial format at a very high rate of speed. Particularly, the preferred embodiment of the present invention is intended to be incorporated in a data communication system complying with IEEE Standard 1394 *"High Performance Serial Bus"* wherein data is transmitted over a twisted-pair cable from a transmitter on one node to a receiver on another node. However, those of ordinary skill in the art will see that the present invention may be implemented in a wider field of use. In light of the reasons discussed in the previous section, it can be seen that it is desirable in high speed serial transmission systems to use differential signals to advantageously limit pulse-width distortion and to reduce other negative effects that are present when transmitting single-ended signals.

Figure 1A:
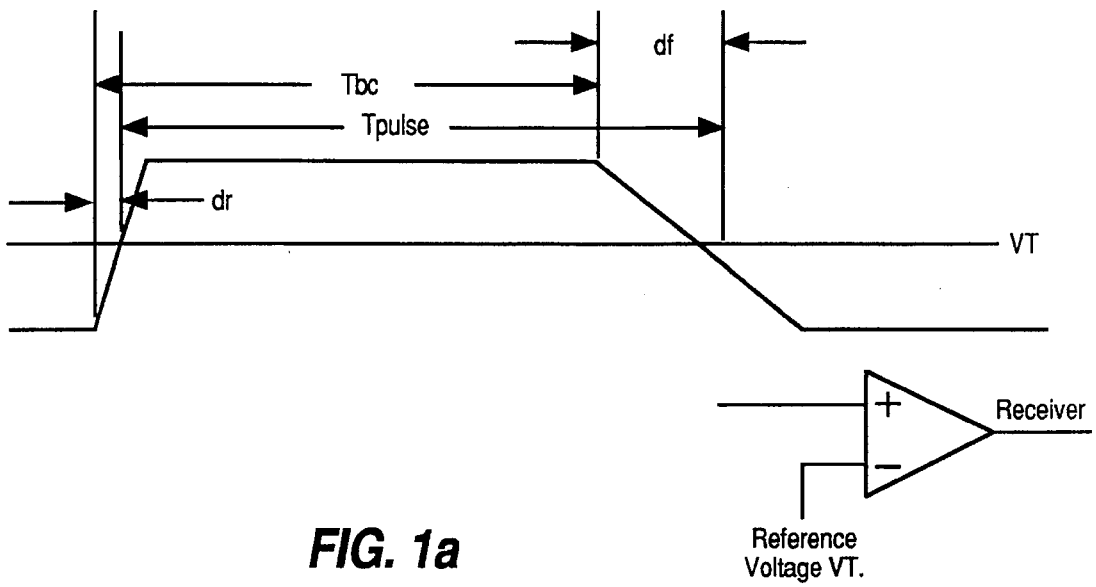
FIGS. 1(a) and 1(b) illustrate graphically a single-ended signal and a differential signal comparing characteristics of duty-cycle distortion.
Figure 1B:
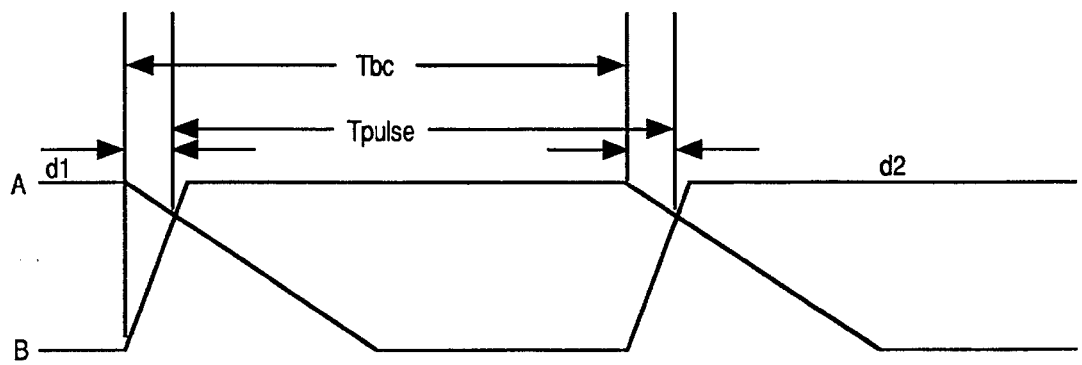
Figure 2:
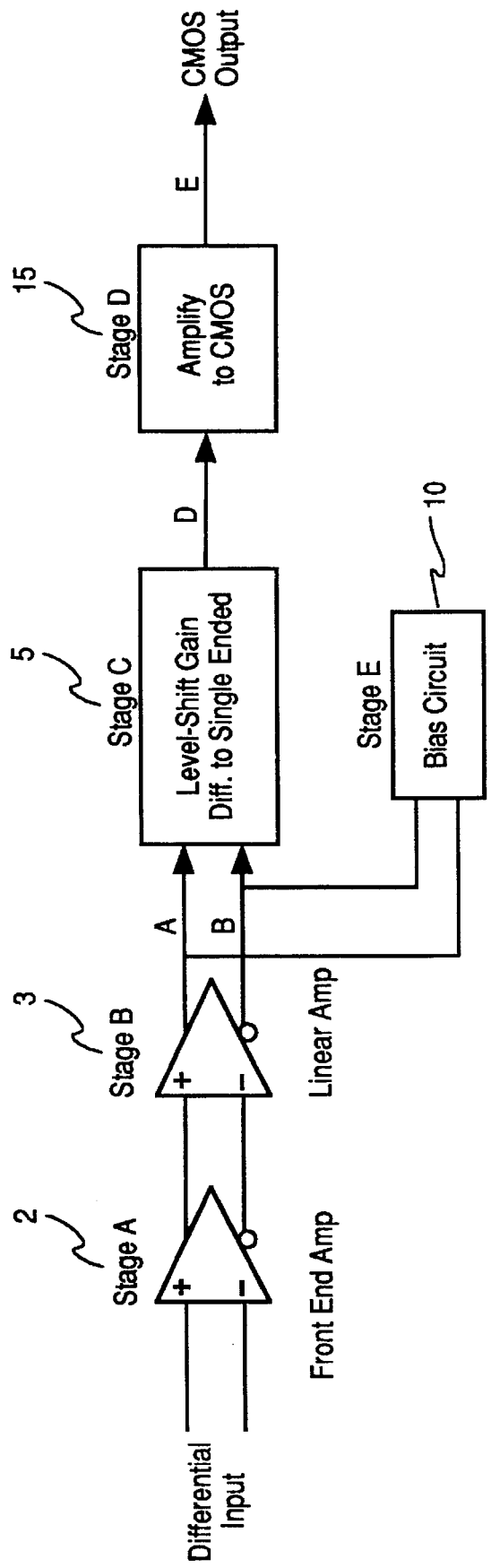
FIG. 2 illustrates a block level diagram of the differential-to-CMOS converter in accordance with the present invention.

FIG. 2 illustrates a block level diagram of the differential-to-CMOS converter of the present invention for producing a single-ended output signal at CMOS logic circuit levels responsive to a small differential input signal. The signal receiver circuit of FIG. 2 is shown consisting of essentially 5 stages. Stage A comprises a front end fully differential low offset amplifier 2. The front end amplifier 2 provides good common mode range and common mode rejection with a differential output level of around 800 MV peak-to-peak. Stage B in FIG. 2 is a low gain linear fully differential amplifier 3. The linear amplifier 3 should provide gain of only 1 to 1.2 and output a differential signal with a common mode voltage near the Vcc supply rails. Linear amplifier 3 should also provide equal rise and fall times for the output signals A and B.

Stages C, D and E comprise the preferred embodiment of the present invention which receive a differential input signal having a common mode voltage near the Vcc supply rail and approximately equal rise and fall times. Stage C comprises level shifting circuitry which provides a differential to single-ended gain of about 1.3 and a common mode level shift of about 2.1 volts. Stage C's single-ended output also provides good matching between its output rise and fall times. Stage D comprises amplifier circuitry 15 which amplifies the stage C output to CMOS levels while also providing fast edges and good rise and fall time matching. Finally, stage E comprises biasing circuitry 10 for biasing stage D at the optimum bias that provides for the least timing distortion (best match in rise and fall time). Biasing stage E also makes the overall circuit's performance independent of process, temperature and power supply.

Figure 3:
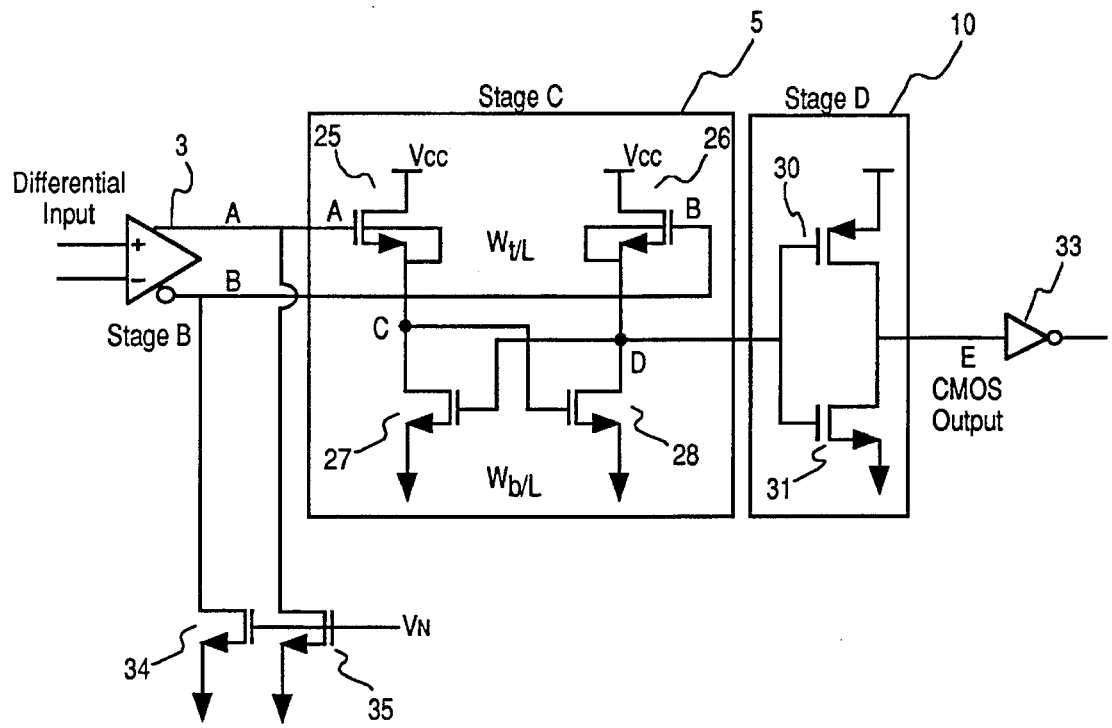
FIG. 3 illustrates a gate level diagram of a portion of the digital-to-CMOS level converter according to one embodiment of the present invention.

FIG. 3 illustrates a more detailed circuit level diagram of the stage C level-shifting circuit 5 and the stage D amplifying circuit 10. The differential signal received by the level-shifting with gain stage 5 is the output from the linear amplifier circuit 3 stage B. The A and B signals received by stage C have those characteristics described above, that is, approximately equal rise and fall times with a common mode voltage near the power supply rail. Stage C consists essentially of a cross-coupled NMOS level-shift circuit. This type of circuit acts to match the rise and fall times of its outputs and is therefore very useful for minimizing timing distortion. At the same time this circuit provides a useful common mode level shift necessary to bias the next stage while providing gain and having high bandwidth.

Differential signal constituents A and B are received by the level-shifting stage 5 with signal A being coupled to the gate of n-channel transistor 25 and signal B being supplied to the gate of n-channel transistor 26. The drains of both n-channel transistors 25 and 26 are coupled to the voltage source supply of approximately +5.0 volt. The level shifter with gain circuit 5 further includes n-channel transistors 27 and 28. Transistor 27 has its drain coupled to the source of transistor 25 and its source coupled to ground. N-channel transistor 28 has its drain coupled to the source of transistor 26 and its source coupled to ground. This transistor arrangement is further cross-coupled with the gate of n-channel transistor 28 being coupled to the source of transistor 25 and drain of transistor 27, while the gate of n-channel transistor 27 is coupled to the drain of transistor 28 and the source of transistor 26.

Figure 4:
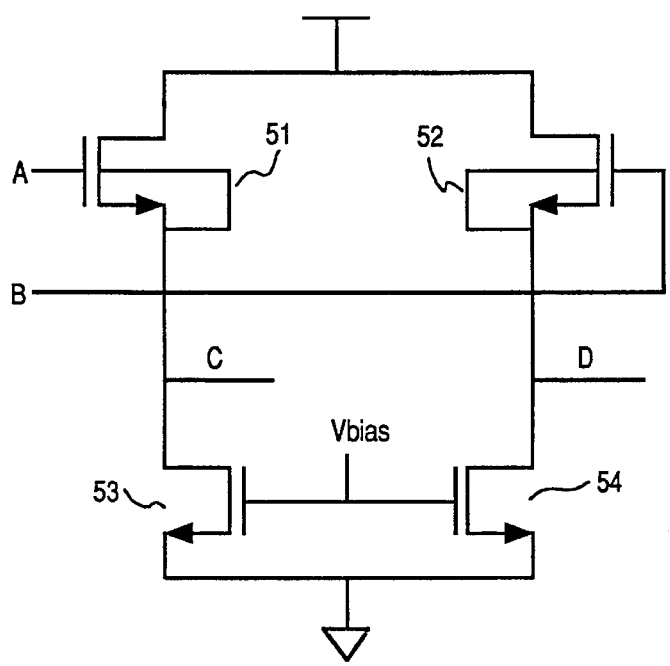
FIG. 4 illustrates an alternative to the present invention lacking the advantages of the present invention.

The way in which the cross coupled circuit matches the rise and fall times can be understood by first looking at the performance of a non-cross coupled NMOS level shift circuit shown in FIG. 4. As signal A rises so does signal C and it rises fairly rapidly since the current in transistor 51 is increased due to charging of capacitance attached to node C. As signal A rises signal B falls (since its a differential input) this causes signal D to fall but it falls more slowly than C rises since the current in transistor 52 is decreased due to discharge of capacitance at node D. This assumes that all transistors are biased in their active region and that transistors 53 and 54 act as current sources biased by Vbias reference voltage.

Referring back now to FIG. 3 where the gates to transistors 27 and 28 are cross-coupled. As signal A rises signal C would like to rise quickly and so strongly increases the current in source transistor 28 thus speeding up the fall in signal D which otherwise would fall slowly. Now signal D will help speed up the rise in signal C by reducing the current in transistor 27 but since it wants to be slower it does less to speed up the signal C rise time than signal C does to speed up signal D's fall time; this process tends to match the rise and fall time of signal D and C by speeding up the fall time more than speeding up the rise time.

The gain of the cross coupled circuit is controlled by the size ratio between Wt (width of the top transistors) and Wb (width of the bottom transistors). Note that it is assumed that the channel lengths are equal. Since the cross coupled circuit is positive feed back the loop gain must be less than 1 (Wt=a*Wb, a>1) otherwise the circuit becomes a bi-stable latch. Note that in this embodiment the transistors 25 and 26 are shown body connected to minimize attenuation due to body effect.

Figure 5:
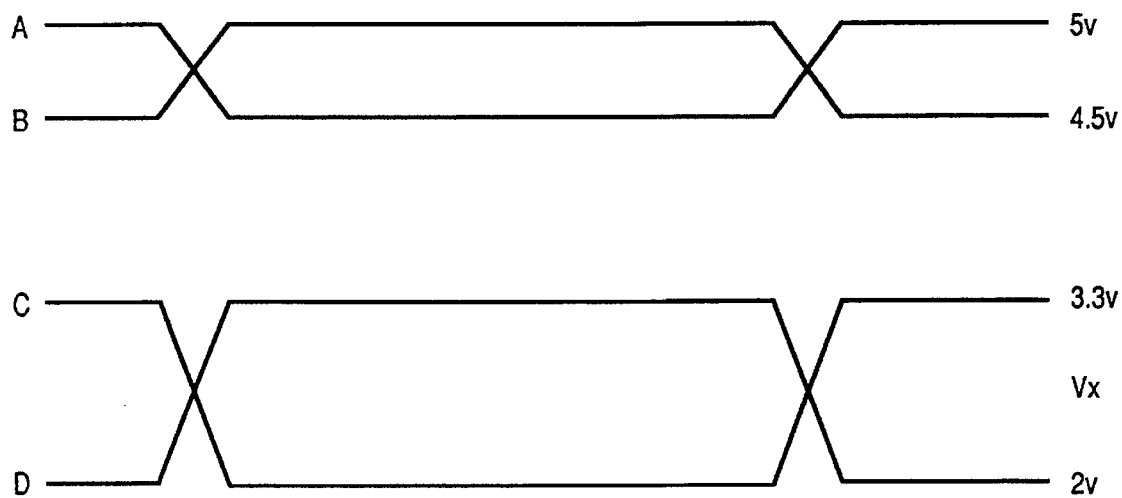
FIG. 5 illustrates a signal timing diagram to illustrate corresponding signal levels at various nodes throughout of the circuitry of the present invention.

Typical signal waveforms are shown in FIG. 5. The input signals A and B swing between 4.5 and 5 volts. The output signal D is inverted with respect to A minus B differential input signal and is 1.3 v pp. (this corresponds to a closed loop gain of 1.3 and is set by a=1.92 in the transistor width ratio formula above). The common mode of the output is the common mode voltage at the input less than Vgs drop of the top transistors and is typically 2.65 volts.

The amplifier stage 10 of the present invention is illustrated in FIG. 3 as a pair of complimentary transistors, p-channel transistor 30 and n-channel transistor 31, such as is common with most inverters. The signal coming from node D is input to the gates of the two transistors 30 and 31. P-channel transistor 30 has its source coupled to the 5 volt power supply while n-channel transistor 31 has its source coupled to ground. The drains of the two transistors are tied and output a signal which is an inversion of input signal D and amplified to CMOS logic circuit voltage levels swinging between 0 and +5 volts. The CMOS transistors 30 and 31 are optimally utilized with the p-channel transistor having twice the channel width of the n-channel transistor giving transistor 30 approximately the same strength as transistor 31. There is also shown in FIG. 3 an inverter 33 which may be provided, for example, if the CMOS digital level signal is to be fanned out to a plurality of destinations.

Finally, FIG. 3 illustrates n-channel transistors 34 and 35 coupled to the differential input signals A and B. The gate voltage driven on these transistors, $V_N$, is the result of the feedback biasing circuit to be described further herein with respect to FIG. 6. As is shown in FIG. 5, the level shifted voltages C and D, upon transition, cross at a voltage level $V_x$. All transitions between C and D will cross at this level $V_x$. As indicated it is desirable that the inverting amplifier and circuitry of FIG. 3 have a threshold that is equal to $V_x$ so that the single-ended signal levels will have their transitions at the proper time. This is facilitated by the stage E biasing circuit 14 which is composed of elements that are process replicas of the amplifying and level shifting circuitry of FIG. 3.

Figure 6:
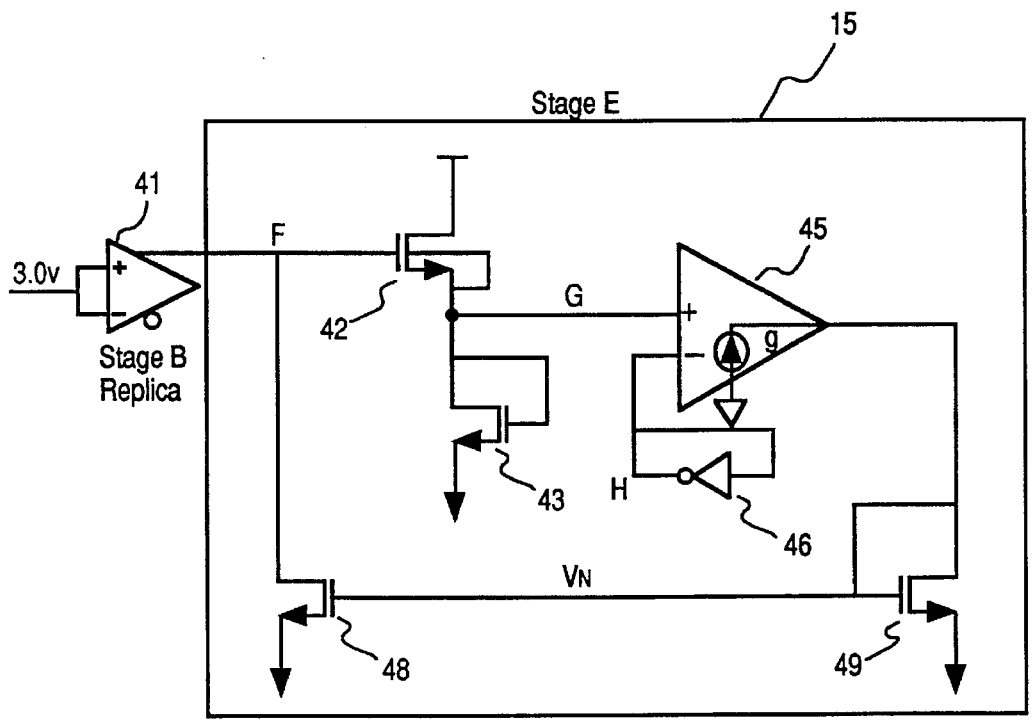
FIG. 6 illustrates one embodiment of a biasing circuit to be used in conjunction with the differential-to-CMOS converter of the present invention.

The input to the stage E biasing circuit 15 of FIG. 6 is a replica circuit 41. The replica 41 is a process replica of the stage B linear amplifier 3 having its inputs shorted to around 3.0 volts. The output from the stage B replica 41 is driven to n-channel transistors 42 and 43. Transistors 42 and 43 are an equivalent replica of the cross coupled circuit of stage C with inputs shorted. The output from the replica transistor series 42 and 43 is provided to a transconductance amplifier 45 which outputs current based on an applied input voltage. Coupled to the inverting input of the transconductance amplifier 45 is an inverter 46. The inverter 46 is an equivalent replica of the complimentary transistor pair 30 and 31 tied back onto itself. The current from the transconductance amplifier 45 is fed to the current mirror transistor pair 48 and 49 whose gates are coupled and which provide the biasing gate voltage $V_N$ for biasing transistors 34 and 35 of the level shifting and amplifying circuit of FIG. 3. Note that n-channel transistors 34 and 35 are equivalent replicas of transistor 48, each having their gates connected to the same voltage $V_N$.

The Bias circuit forces the voltage at node G to equal the voltage at node H. The transconductance amplifier increases its output current if node G is a higher voltage than node H, this increased current is mirrored through transistors 48 and 49 and forces node F down by sinking increased current from the stage B replica (whose output impedance is few k ohms); as node F drops so does node G forcing node G voltage to equal H. If node G voltage is too high the transconductance amplifier's output current is decreased which causes node F to rise which causes node G to rise to equal the node H voltage.

By definition the common mode voltage at the input to Stage C is the voltage on A and B when the input to stage B is shorted and so will equal the voltage at node F of the replica; therefore the common mode voltage at node D will equal the voltage at node G which equals the voltage at node H and this happens to be the threshold of the stage D amplifier. This means that the threshold of stage D corresponds to the common mode voltage at the stage C input. Now if stage B is designed such that A and B's rise and fall times are equal then these signals cross at their common mode voltage; so the crossing at the inputs A and B corresponds to when D crosses the threshold of stage D and if signal D has matched rise and fall times (which cross coupling helps to insure) then the single-ended CMOS output at E will represent the differential input signals A and B without timing distortion. Also it should be pointed out that the rise and fall times at the CMOS output will match very well since stage D was biased at its threshold which means transistors 30 and 31 have equal strength regardless of process variations.

The bias circuit requires that when the current in transistor 48 is zero that the node voltage at G is higher than the threshold of stage D (which is the same as inverter A, node voltage H). This forces the width size ratio "a" of the cross-coupled transistor arrangement to be greater than 1.92 which means the gain of the cross-coupled gate will be less than or equal to 1.3.

For a 100-Mbaud implementation it has been found that the transistors described herein should have the following sizes with measurements in microns:

Transistors 25 and 26: 1.92×6/3,

Transistors 27, 28 and 31: 6/3,

Transistor 30: 2×6/3, and

Transistors 34, 35 and 48: 50/8.

Although the present invention has been described in terms of preferred embodiments, it will be appreciated that various modifications and alterations might be made by those skilled in the art without departing from the spirit and scope of the invention. The invention should, therefore, be measured in terms of the claims which follow.

I claim:

1. An apparatus for converting a small amplitude differential signal to a single-ended signal suitable for use in CMOS logic circuits, said apparatus comprising:

a first cross-coupled level shifting circuit for receiving said differential signal and for outputting a shifted signal, said first cross-coupled level shifting circuit including a cross-coupled feedback loop having a loop gain of less than one;

a first amplification circuit for amplifying said shifted signal to a level suitable for use in CMOS logic circuits; and a biasing circuit coupled to said first cross-coupled level shifting circuit for biasing said first cross-coupled level shifting circuit and said first amplification circuit, wherein said apparatus is implemented in a CMOS digital logic process.

2. The apparatus of claim 1 wherein said differential signal comprises first and second signal components, said first cross-coupled level shifting circuit comprising:

first and second transistors each having a gate, the gate of said first transistor coupled to the first signal component of said differential signal and said gate of said second transistor coupled to the second component of said differential signal, the drains of said first and second transistors being coupled to a power supply corresponding to a CMOS high logic level; and third and fourth transistors having sources coupled to ground, drains coupled respectively to the sources of said first and second transistors, said third and fourth transistors forming the cross-coupled feedback loop as a cross-coupled pair of transistors.

3. The apparatus of claim 2 wherein said first, second, third and fourth transistors are each n-channel transistors having equal channel lengths, said first and second transistors each having a channel width approximately double the channel widths of said third and fourth transistors.

4. The apparatus of claim 3 wherein said first and second transistors have channel widths approximately 1.92 times larger than the channel widths of said third and fourth transistors.

5. The apparatus of claim 2 wherein said first amplification circuit comprises a pair of complimentary transistors coupled to said first level shifting circuit for receiving said shifted signal and outputting an amplified signal.

6. The apparatus of claim 5 wherein said pair of complimentary transistors comprises a p-channel transistor and an n-channel transistor, said p-channel transistor having a channel width approximately twice the channel width of the n-channel transistor.

7. The apparatus of claim 1 further comprising a second amplification circuit for fanning out said amplified signal suitable for use in CMOS logic circuits.

8. The apparatus of claim 2 wherein said biasing circuit comprises:

first and second biasing transistors coupled to said first cross-coupled level shifting circuit where said first cross-coupled level shifting circuit receives said first and second components of said differential signal, said first and second biasing transistors being responsive to a biasing voltage; and a closed-loop biasing circuit composed of a second level shifting circuit and a second amplification circuit, said closed-loop biasing circuit coupled to said first and second biasing transistors for providing said biasing voltage.

9. The apparatus of claim 8 wherein said biasing circuit comprises:

a transistor pair with physical dimensions substantially similar to the transistor pair constituted by said first and third transistors in said first cross-coupled level shifting circuit, said transistor pair receiving a fixed input voltage;

a transconductance amplifier receiving as one input the output from said transistor pair;

an inverter having an output and an input, said output being connected both to said input of said inverter and to a second input of said transconductance amplifier, said inverter comprising transistors with physical dimensions substantially similar to the complimentary pair of transistors from said first amplification circuit; and a current mirror coupled to the output of said transconductance amplifier and to said fixed input voltage, said current mirror comprising two transistors with tied gate electrodes, wherein said biasing voltage is the signal between said tied gate electrodes.

10. The apparatus of claim 9 wherein said differential signal is one having approximately equal rise and fall times with a voltage swing between approximately 4.5 and 5.0 volts and said single-ended signal suitable for use in CMOS logic circuits swings between 0 and +5 volts.

11. A signal converter for converting a small amplitude differential signal into a single-ended signal suitable for use by complimentary metal-oxide-semiconductor (CMOS) circuits, said differential signal comprising first and second signal components, said signal converter comprising:

a CMOS digital logic transistor arrangement including a cross-coupled pair of transistors that form a cross-coupled feedback loop, the transistor arrangement for receiving said differential signal and level shifting said signal with gain, said cross-coupled feedback loop having a loop gain that is less than one;

an inverting amplifier coupled to said transistor arrangement for receiving an output signal from said transistor arrangement and providing additional gain to said signal to bring it to CMOS signal levels; and a closed-loop biasing circuit coupled to said transistor arrangement for biasing said signal converter.

12. The signal converter of claim 11 wherein said transistor arrangement comprises four n-channel transistors arranged in two series of upper and lower transistors, said four transistors having equivalent channel lengths and said upper transistors having channel widths approximately twice the channel widths of the lower transistors, said lower transistors being cross-coupled.

13. The signal converter of claim 12 wherein said upper transistors have channel widths approximately 1.92 times larger than said lower transistors.

14. The signal converter of claim 11 wherein said inverting amplifier comprises a p-channel transistor coupled to an n-channel transistor, said p-channel and n-channel transistors having approximately equal channel lengths, said p-channel transistor have approximately double the channel width of said n-channel transistor.

15. The signal converter of claim 12 wherein said closed-loop biasing circuit comprises:

a transistor pair with physical dimensions substantially similar to an upper and lower transistor series in said transistor arrangement, said transistor pair receiving a fixed input voltage;

a transconductance amplifier receiving as one input the output from said transistor pair;

an inverter having an output and an input, said output being connected both to said input of said inverter and to a second input of said transconductance amplifier, said inverter comprising transistors with physical dimensions substantially similar to the complimentary pair of transistors from said inverting amplifier; and a current mirror coupled to the output of said transconductance amplifier and to said fixed input voltage, said current mirror comprising two transistors with tied gate electrodes, wherein said biasing voltage is the voltage between said tied gate electrodes.

16. The apparatus of claim 15 wherein said differential signal is one having approximately equal rise and fall times with a voltage swing between approximately 4.5 and 5.0 volts and said single-ended signal suitable for use in CMOS logic circuits swings between 0 and +5 volts.

17. A method of converting a small amplitude differential signal to a single-ended signal suitable for use by CMOS logic circuits, said method comprising the steps of:

level shifting said differential signal from a first level to a second level with a cross-coupled level shifting circuit implemented in a CMOS digital logic process while providing gain to said signal, said cross-coupled level shifting circuit including a cross-coupled feedback loop having a loop gain of less than one;

amplifying the signal once it has been level shifted with gain to CMOS logic circuit levels; and biasing the level shifting and amplifying circuitry to ensure that signal level transitions are properly detected.

18. The method according to claim 17 wherein said level shifting step comprises providing said differential signal to a cross-coupled gate of n-channel transistors.

19. The method according to claim 17 wherein said biasing step comprises the steps of providing a biasing voltage to level shifting circuitry wherein said biasing voltage is produced from a closed-loop biasing circuit composed of a level shifting circuit and an amplifying circuit.

* * * * *